US010945355B2

(12) United States Patent
Kitanaka et al.

(10) Patent No.: US 10,945,355 B2
(45) Date of Patent: Mar. 9, 2021

(54) POWER CONVERSION DEVICE

(71) Applicant: Mitsubishi Electric Corporation, Tokyo (JP)

(72) Inventors: Hidetoshi Kitanaka, Tokyo (JP); Hidetoshi Sumita, Tokyo (JP); Yu Hirayama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/315,256

(22) PCT Filed: Jul. 27, 2016

(86) PCT No.: PCT/JP2016/072039
§ 371 (c)(1),
(2) Date: Jan. 4, 2019

(87) PCT Pub. No.: WO2018/020615
PCT Pub. Date: Feb. 1, 2018

(65) Prior Publication Data
US 2019/0166729 A1 May 30, 2019

(51) Int. Cl.
*H05K 7/20* (2006.01)
*H05K 7/00* (2006.01)
(Continued)

(52) U.S. Cl.
CPC ........ *H05K 7/20918* (2013.01); *H02M 3/155* (2013.01); *H02M 7/003* (2013.01);
(Continued)

(58) Field of Classification Search
CPC .......... H05K 5/00; H05K 7/20; H05K 7/2048; H05K 7/20909; H05K 7/20154;
(Continued)

(56) References Cited

U.S. PATENT DOCUMENTS 5,091,823 A * 2/1992 Kanbara ................. H02M 5/44
174/351
2001/0030881 A1 10/2001 Yamaguchi et al.
(Continued)

FOREIGN PATENT DOCUMENTS

DE 10 2014 221 143 A1 4/2016
EP 0 794 098 A1 9/1997
(Continued)

OTHER PUBLICATIONS

Junji, English Translation JPH07231691, Aug. 1995 (Year: 1995).*
(Continued)

*Primary Examiner* — Zachary Pape
*Assistant Examiner* — Amir A Jalali
(74) *Attorney, Agent, or Firm* — Buchanan Ingersoll & Rooney PC

(57) ABSTRACT

Electronic components included in a power conversion unit are housed in a closed section of a first unit, and the first unit includes a heat sink exposed to an open section and releases heat transferred from the electronic components. A blower is housed in a first space of a second unit, and at least a portion of an impeller of the blower is exposed to a second space from an opening. A reactor is housed in a third unit. Outside air flows through a flow inlet into an interior of the power conversion device, passes through the open section, a first vent, the second space, the opening, the first space, a second vent, and the third unit, and then is discharged to the exterior of the power conversion device from a flow outlet.

12 Claims, 8 Drawing Sheets

(51) Int. Cl.
*H02M 7/48* (2007.01)
*H02M 3/155* (2006.01)
*H02M 7/00* (2006.01)

(52) U.S. Cl.
CPC .......... *H02M 7/48* (2013.01); *H05K 7/20409* (2013.01); *H05K 7/20909* (2013.01); *B60L 2200/26* (2013.01); *B60L 2210/42* (2013.01)

(58) Field of Classification Search
CPC .......... H05K 7/20172; H05K 7/20209; H05K 7/20409; H05K 7/20863; H05K 7/20918; H05K 7/2045; H02M 7/00; H02M 7/003; H02M 7/53871; B60L 2200/26; B60L 2210/42
USPC .......................... 361/692, 695, 704, 717, 752
See application file for complete search history.

(56) References Cited

U.S. PATENT DOCUMENTS

| | | | |
|---|---|---|---|
| 2007/0273312 A1* | 11/2007 | Sakurai | H02M 1/38 318/543 |
| 2009/0114377 A1* | 5/2009 | Zheng | F24F 1/0007 165/126 |
| 2012/0044644 A1* | 2/2012 | Harlan | F04D 25/166 361/695 |
| 2014/0233183 A1* | 8/2014 | Horng | G06F 1/203 361/692 |
| 2015/0062811 A1 | 3/2015 | Suzuki et al. | |
| 2015/0360568 A1* | 12/2015 | Champagne | B60L 1/02 296/156 |
| 2017/0086336 A1* | 3/2017 | Matsuoka | H02M 7/04 |
| 2017/0259835 A1 | 9/2017 | Frank | |
| 2018/0191183 A1* | 7/2018 | Namiki | H05K 7/20145 |
| 2019/0020279 A1* | 1/2019 | Kitanaka | H01F 27/025 |
| 2019/0173396 A1* | 6/2019 | Arao | H02H 7/122 |
| 2019/0181796 A1* | 6/2019 | Kim | H02S 40/36 |
| 2019/0208671 A1* | 7/2019 | Kitanaka | H05K 7/20863 |

FOREIGN PATENT DOCUMENTS

| | | | |
|---|---|---|---|
| JP | 60076461 A | | 4/1985 |
| JP | 61115767 A | | 6/1986 |
| JP | 02249755 A | | 10/1990 |
| JP | 04266089 A | | 9/1992 |
| JP | 07052790 A | | 2/1995 |
| JP | H 07231691 A | * | 8/1995 |
| JP | 2001258263 A | | 9/2001 |
| JP | 2001332883 A | | 11/2001 |
| JP | 2003079164 A | * | 3/2003 |
| JP | 2003341507 A | | 12/2003 |
| JP | 2007097366 A | | 4/2007 |
| JP | 2011188671 A | * | 9/2011 |
| JP | 2013154689 A | | 8/2013 |
| JP | 2015050257 A | | 3/2015 |

OTHER PUBLICATIONS

Eto, English Translation JP 2011188671, Sep. 2011 (Year: 2011).*
Masaki, English Translation JP 2003079164, Mar. 2003 (Year: 2003).*
International Search Report (PCT/ISA/210) dated Oct. 18, 2016, by the Japan Patent Office as the International Searching Authority for International Application No. PCT/JP2016/072039.
Written Opinion (PCT/ISA/237) dated Oct. 18, 2016, by the Japan Patent Office as the International Searching Authority for International Application No. PCT/JP2016/072039.
Extended European Search Report dated Jun. 26, 2019, issued by the European Patent Office in corresponding European Application No. 16910518.6. (8 pages).
Indian Office Action dated Mar. 3, 2020 issued in corresponding Indian Patent Application No. 201947000846 (5 pages).

* cited by examiner

POWER CONVERSION DEVICE

TECHNICAL FIELD

The present disclosure relates to a power conversion device.

BACKGROUND ART

A power conversion device that converts power acquired from a power line to power for supplying to an electric motor or vehicle-mounted equipment is mounted on a roof or below a floor of an electric railway vehicle. The power conversion device has a power conversion unit that, by switching operation of semiconductor elements, converts input power to a desired alternating current power for output. The semiconductor elements generate heat during the switching operation, and thus fins or a spike-array-shaped heat sink is formed for dissipation of heat transferred from the semiconductor elements. The heat sink is arranged at a position in contact with outside air in order to increase cooling efficiency. However, in order to prevent failure caused by dust or moisture, electronic components that are included in an output controller that outputs a control signal to the power conversion unit and the semiconductor elements included in the power conversion unit are arranged in an interior of a housing so as not to contact the outside air. In this manner, installation positions of each component included in the power conversion device are determined in accordance with the necessity for cooling as well as the necessities for dust prevention and moisture prevention.

Patent Literature 1 describes as background art a container box of an forced-air-cooled vehicular apparatus accommodating device is described as having a semiconductor chamber into which the outside air does not flow, a blower chamber, and an air channel. An air inlet is formed in a sidewall of the blower chamber, and a cross-flow fan arranged in the blower chamber sucks in the outside air and discharges air toward the air channel. Cooling fins mounted with semiconductor elements are arranged in the air channel, and temperature rise of the semiconductor elements is suppressed by cooling of the cooling fins using the air from the cross-flow fan.

CITATION LIST

Patent Literature

Patent Literature 1: Unexamined Japanese Patent Application Kokai Publication No. S60-076461

SUMMARY OF INVENTION

Technical Problem

Each of the semiconductor chamber, the blower chamber, and the air channel is arranged in the aforementioned forced-air cooling type vehicular apparatus accommodating device, the fan is housed in a casing, and thus such configuration suffers from an increased size of the apparatus, an increased number of component parts, and greater complexity of assembly work.

In consideration of the aforementioned circumstances, an objective of the present disclosure is to simplify structure of the power conversion device while maintaining cooling performance.

Solution to Problem

In order to attain the aforementioned objective, a power conversion device of the present disclosure includes a power conversion unit to convert an input power and output the converted power, a reactor connected to an input side of the power conversion unit, and a controller to control electronic components included in the power conversion unit, and further includes a first unit, a second unit, and a third unit. For the first unit, an interior of a housing thereof is divided by a partition into a closed section into which outside air does not flow and an open section into which the outside air flows. The first unit contains electronic components in the closed section, and has a heat sink exposed to the open section to release heat transferred from the electronic components. The second unit is adjacent to the first unit, and an interior of a housing of the second unit is divided into a first space and a second space by a partition that has an opening. The second unit contains in the first space a blower having an impeller at least partially exposed to the second space from the opening, the blower blowing air from the second space toward the first space. The third unit is adjacent to the second unit and contains the reactor. A first vent is formed in a part at which a housing forming the open section contained within the first unit and a housing forming the second space contained within the second unit contact each other. A flow inlet into which the outside air flows is formed in the housing forming the open section contained within the first unit. A second vent is formed in a part at which a housing forming the first space contained within the second unit and a housing of the third unit contact each other. A flow outlet is formed in the housing of the third unit to discharge air flowing in from the second vent.

Advantageous Effects of Invention

According to the present disclosure, the first unit is provided that has the open section and the closed section containing electronic components included in the power conversion unit; the second unit is provided that contains the blower; the third unit is provided that contains the reactor; and a flow path of air is arranged from the flow inlet of the first unit, through the second unit, and to the flow outlet of the third unit; and thus structure of the power conversion device can be simplified while maintaining cooling performance.

DESCRIPTION OF EMBODIMENTS

Figure 1:
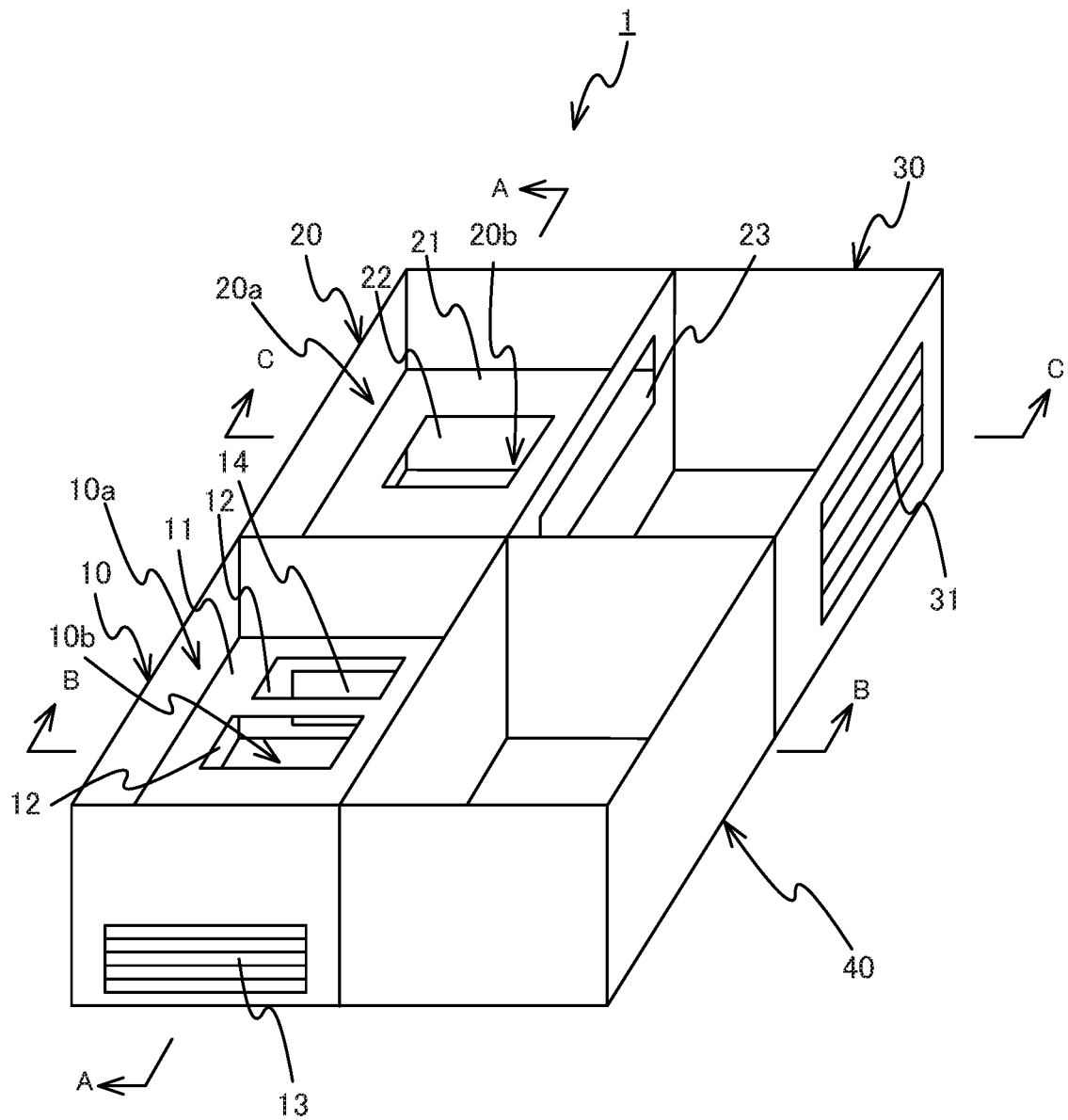
FIG. 1 is a perspective view of housings of a power conversion device according to an embodiment of the present disclosure.

Embodiments of the present disclosure are described below in detail with reference to drawings. In the drawings, components that are the same or equivalent are assigned the same reference sign.

FIG. 1 is a perspective view of housings of a power conversion device according to an embodiment of the present disclosure. In FIG. 1, an upper surface of a power conversion device 1 is omitted. The power conversion device 1 is configured as an assembly of each of the below-described units. Due to securing of a flow path of air passing through the units, each of the parts of the power conversion device 1 can be cooled. In the example of FIG. 1, the power conversion device 1 includes a first unit 10, a second unit 20, a third unit 30, and a fourth unit 40 that each has the same size; the first unit 10 is adjacent to the second unit 20; and the fourth unit 40 is adjacent to the third unit 30. That is, in the example of FIG. 1, a direction in which the first unit 10 and the second unit 20 are adjacent to each other is orthogonal to a direction in which the second unit 20 and the third unit 30 are adjacent to each other, and the fourth unit 40 is adjacent to the first unit 10 and the third unit 30. At the power conversion device 1 upper surface that is not illustrated in FIG. 1, an opening part is arranged through which are detachably attached electronic components included in the power conversion device 1, and a lid is arranged to close the opening part.

For the first unit 10, an interior of the housing thereof is divided by a partition 11 into a closed section 10a into which outside air does not flow and an open section 10b into which the outside air flows. The closed section 10a contains electronic components included in a power conversion unit as described below, and the first unit 10 has a heat sink exposed to the open section 10b to release heat transferred from the electronic components. An opening 12 formed in the partition 11 is closed by a below-described board on which the electronic components are arranged, and thus the outside air does not flow into the closed section 10a that is the space that contains the electronic components. Although two openings 12 are formed in the partition 11 in the example of FIG. 1, the number of the openings 12 is freely selected. A first vent 14 is formed in a part where a housing forming the open section 10b contained with the first unit 10 contacts a housing forming a below-described second space contained within the second unit 20. A flow inlet 13 into which the outside air flows is formed in the housing forming the open section 10b contained within the first unit 10.

For the second unit 20, an interior of the housing thereof is divided by a partition 21 into a first space 20a and a second space 20b, and an opening 22 is formed in the partition 21. In the aforementioned manner, the first vent 14 is formed in the part where the housing forming the open section 10b contained within the first unit 10 contacts the housing forming the second space 20b contained within the second unit 20. A second vent 23 is formed in a part where the housing forming the first space 20a contained within the second unit 20 contacts a housing of the third unit 30. The second unit 20 contains a below-described blower that blows air from the second space 20b toward the first space 20a.

In the housing of the third unit 30, a second vent 23 is formed and a flow outlet 31 is formed to discharge air flowing in from the second vent 23. The third unit 30 contains a below-described reactor. Due to operation of the blower housed in the second unit 20, the outside air flowing from the flow inlet 13 into the open section 10b passes through the first vent 14 and flows into the second space 20b. The air flowing into the second space 20b passes through the opening 22, flows into the first space 20a, passes through the second vent 23, flows into the third unit 30, and is discharged from the flow outlet 31 to the exterior of the power conversion device 1.

The outside air does not flow into the interior of the fourth unit 40. The fourth unit 40 contains electronic components requiring protection from moisture and dust.

Figure 2:
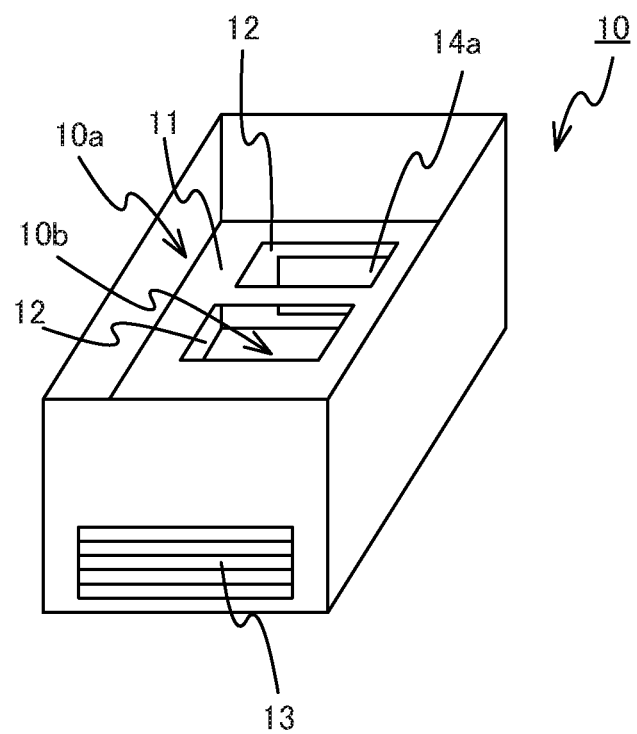
FIG. 2 is a perspective view of a housing of a first unit according to the embodiment.
Figure 3:
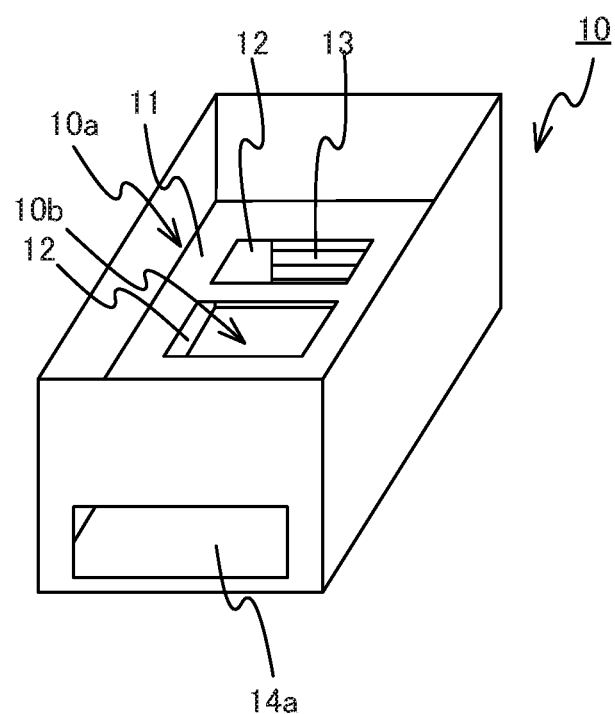
FIG. 3 is another perspective view of the housing of the first unit according to the embodiment.
Figure 4:
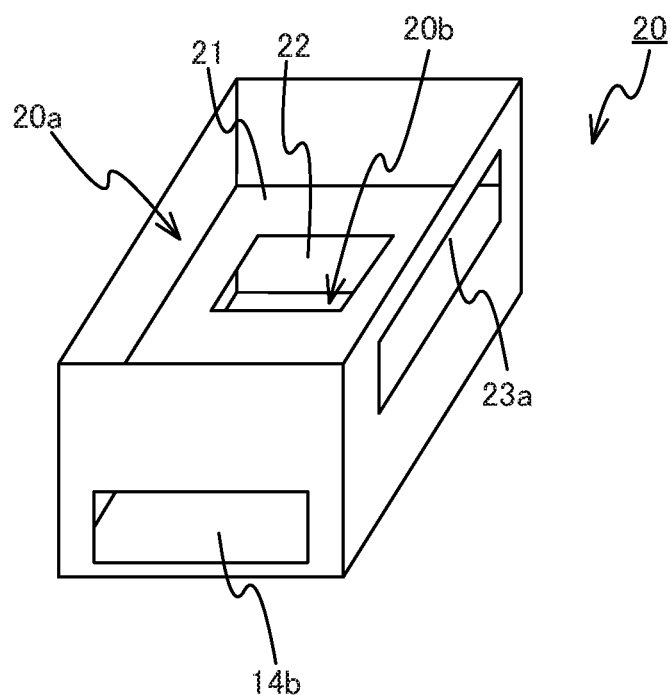
FIG. 4 is a perspective view of a housing of a second unit according to the embodiment.
Figure 5:
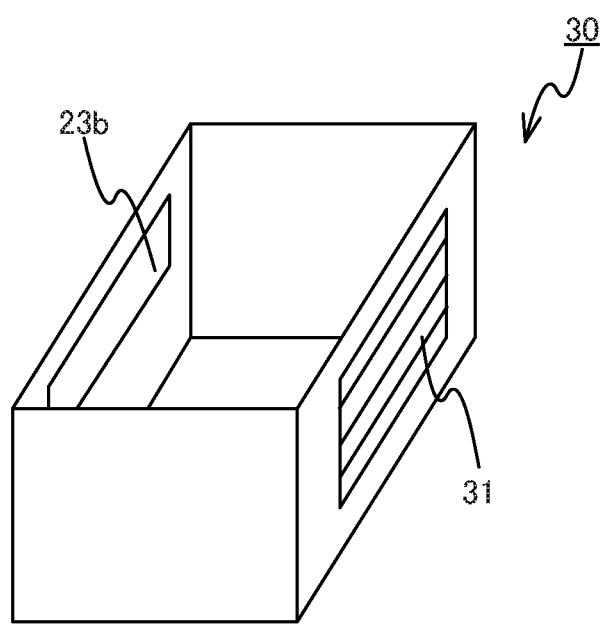
FIG. 5 is a perspective view of a housing of a third unit according to the embodiment.

FIGS. 2 and 3 are perspective views of the housing of the first unit according to the embodiment. FIG. 4 is a perspective view of the housing of the second unit according to the embodiment. FIG. 5 is a perspective view of the housing of the third unit according to the embodiment. In the example of FIGS. 2 to 5, a flow outlet 14a is formed in a portion of the housing of the first unit 10 adjoining the second unit 20 and forming the open section 10b. The flow inlet 13 facing the flow outlet 14a is formed in the housing of the first unit 10. A flow inlet 14b facing the flow outlet 14a is formed in a portion of the housing of the second unit 20 adjoining the first unit 10 and forming the second space 20b. The flow outlet 14a of the first unit 10 and the flow inlet 14b of the second unit 20 form the first vent 14. A flow outlet 23a is formed in a portion of the housing of the second unit 20 adjoining the third unit 30 and forming the first space 20a. A flow inlet 23b facing the flow outlet 23a is formed in a portion of the housing of the third unit 30 adjoining the second unit 20. The flow outlet 23a of the second unit 20 and the flow inlet 23b of the third unit 30 form the second vent 23. The flow outlet 31 facing the flow inlet 23b is formed in the housing of the third unit 30. Although in the aforementioned example the flow inlet 13 and the first vent 14 face each other and the second vent 23 and the flow outlet 31 face each other, the positions of arrangement of the flow inlet 13, the first vent 14, the second vent 23, and the flow outlet 31 are not limited to the aforementioned example. The flow inlet 13, the first vent 14, the second vent 23, and the flow outlet 31 may be arranged at freely selected positions as long as the outside air flows in from the first unit 10, passes through the second unit 20, and is discharged from the third unit 30.

Figure 6:
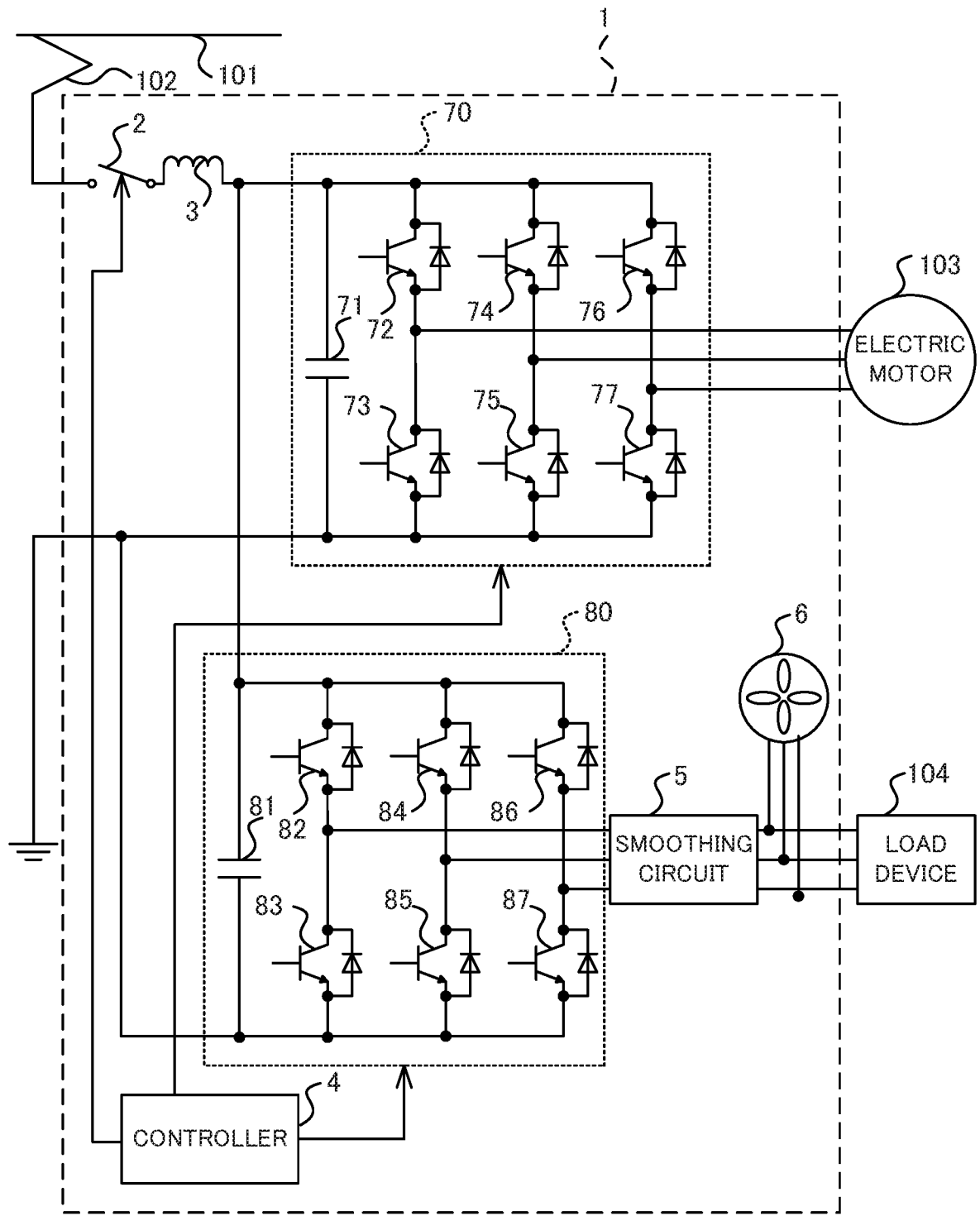
FIG. 6 illustrates an example of mounting the power conversion device according to the embodiment on an electric railway vehicle.

FIG. 6 illustrates an example of mounting the power conversion device according to the embodiment on an electric railway vehicle. The power conversion device 1 converts power acquired from a power line 101 via a power collector 102, and supplies the power to an electric motor 103 that drives the electric railway vehicle and to a load device 104 that is an air-conditioning device or a lighting device. The electric motor 103 and the load device 104 are connected to the output side of the power conversion device 1. The power acquired from the power line 101 is input to power conversion units 70 and 80 via a switch 2 and an input reactor 3. The power conversion unit 70 is an inverter circuit that has a capacitor 71 and switching elements 72, 73, 74, 75, 76, and 77. The power conversion unit 80 is an inverter circuit that has a capacitor 81 and switching elements 82, 83, 84, 85, 86, and 87. Although an insulated gate bipolar transistor (IGBT) is used as each of the switching elements of FIG. 6, a freely selected semiconductor element may be used as the switching element. The configurations of the power conversion units 70 and 80 are not limited to the example of FIG. 6. In the case of supply of direct current power to the load device 104, the power conversion unit 80 may be a direct-current-to-direct-current (DC-DC) converter.

The reactor 3 is constructed by winding a copper or aluminum conductor into a coil shape. Forced cooling is required due to the generation of large losses from resistance of the conductor during operation of the reactor 3. A controller 4 controls on-off switching of the switch 2 and on-off switching of the switching elements 72, 73, 74, 75, 76, 77, 82, 83, 84, 85, 86, and 87. A smoothing circuit 5 smoothes a pulse waveform output by the power conversion unit 80. Sine wave alternating current is obtained by the smoothing circuit 5. A blower 6 is driven by output of the power conversion unit 80 smoothed by the smoothing circuit 5. The output of the power conversion unit 80 smoothed by the smoothing circuit 5 is supplied to the load device 104. Amounts of generated heat from the switch 2, the controller 4, and the smoothing circuit 5 are small in comparison to the amounts generated from the reactor 3 and the electronic components included in the power conversion units 70 and 80. Prevention of failures due to dust and moisture is required for the switch 2, the controller 4, and the smoothing circuit 5.

Figure 7:
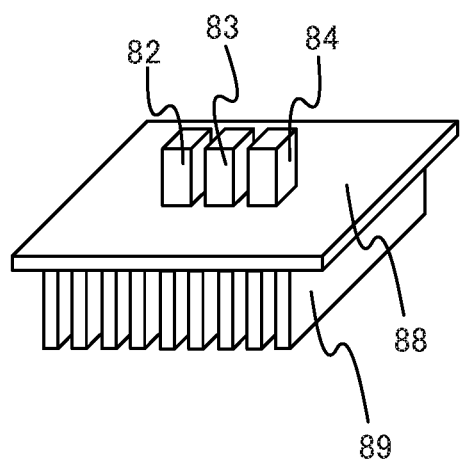
FIG. 7 is a perspective view of electronic components included in the power conversion unit according to the embodiment.

Due to generation of heat, the electronic components included in the power conversion units 70 and 80 require forced cooling by the outside air. FIG. 7 is a perspective view of the electronic components included in the power conversion unit according to the embodiment. The electronic components included in the power conversion units 70 and 80 are arranged on a board 88, and among the surfaces of the board 88, a heat sink is formed at the surface that is opposite to the surface on which the electronic components are arranged. FIG. 7 illustrates the switching elements 82, 83, and 84 included in the power conversion unit 80. In the example of FIG. 7, the switching elements 82, 83, and 84 are arranged on the board 88, and among the surfaces of the board 88, fins 89 are formed as a heat sink on a surface that is opposite to the side on which the switching elements 82, 83, and 84 are arranged.

Figure 8:
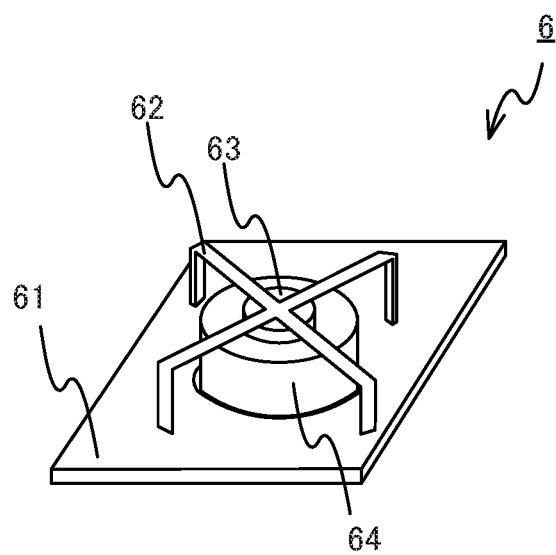
FIG. 8 is a perspective view of a blower according to the embodiment.

FIG. 8 is a perspective view of the blower according to the embodiment. The blower 6 includes a base 61 in which an opening is formed, a support 62 fixed to the base 61, a blower electric motor 63 supported by the support 62, and an impeller 64 rotated by the blower electric motor 63. The impeller 64 is exposed and is not housed in a casing. Although the blower 6 is a centrifugal blower in the example of FIG. 8, a freely-selected type of blower may be used.

Arrangement of the parts of the power conversion device 1 in the housings of the power conversion device 1 illustrated in FIG. 1 is described below. The electronic components included in the power conversion units 70 and 80 requiring forced cooling are housed in the first unit 10; the blower 6 is housed in the second unit 20; the reactor 3 requiring forced cooling is housed in the third unit 30; and the switch 2, the controller 4, and the smoothing circuit 5 are housed in the fourth unit 40. Connecting conductors interconnecting the parts of the power conversion device 1 housed in different units may be run to the exterior of the units, or the connecting conductors may be arranged penetrating the partitions between the units.

Figure 9:
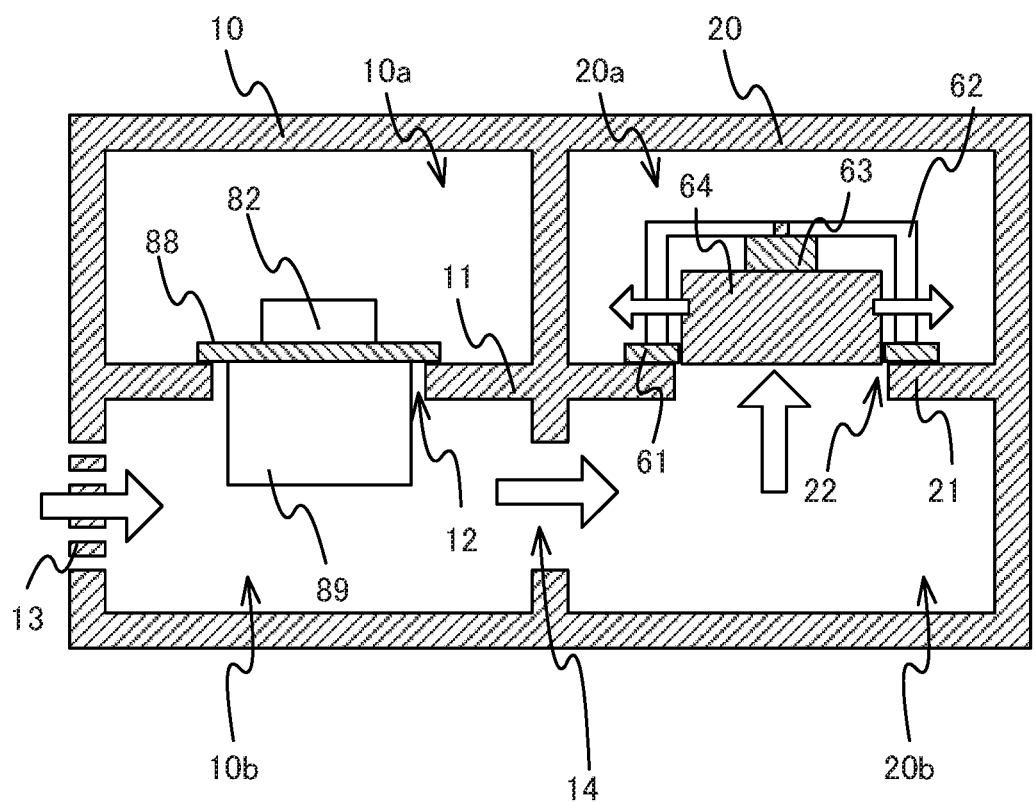
FIG. 9 is a cross-sectional view of the power conversion device according to the embodiment.
Figure 10:
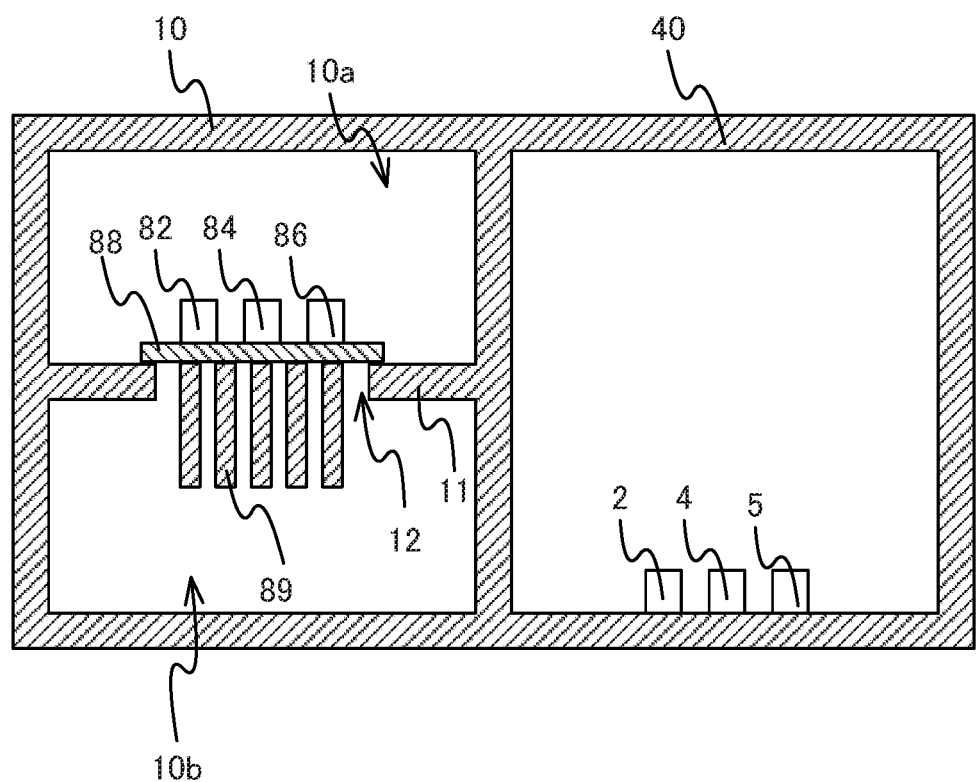
FIG. 10 is another cross-sectional view of the power conversion device according to the embodiment.
Figure 11:
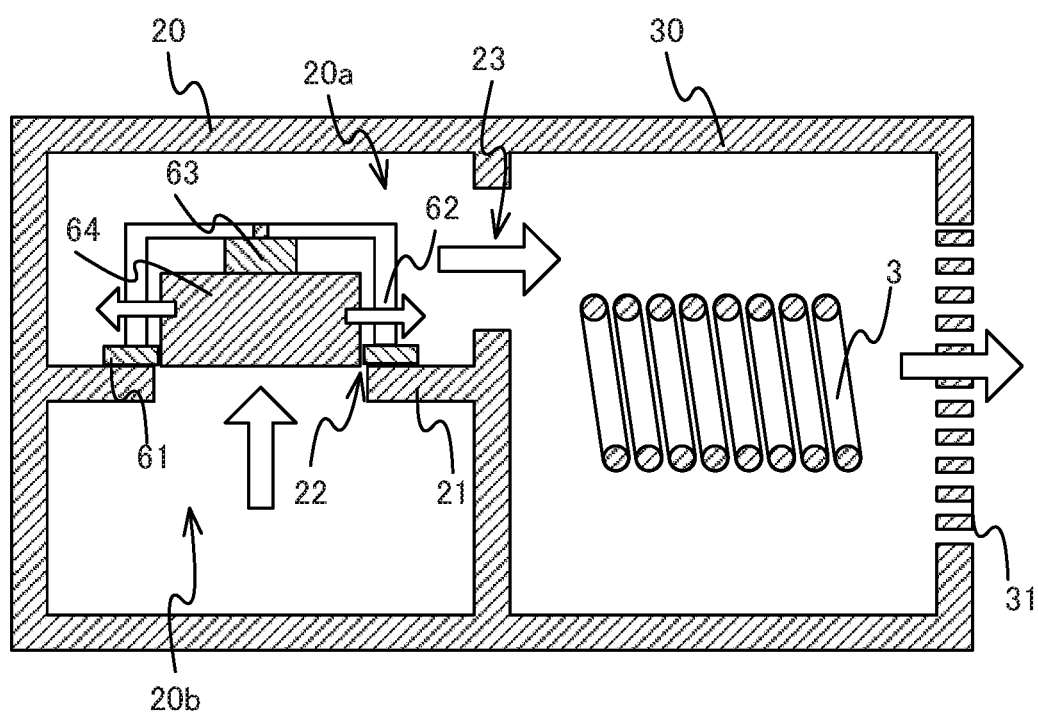
FIG. 11 is yet another cross-sectional view of the power conversion device according to the embodiment.

FIGS. 9, 10, and 11 are cross-sectional views of the power conversion device of the embodiment. FIG. 9 is a cross-sectional view taken along line A-A in FIG. 1, FIG. 10 is a cross-sectional view taken along line B-B in FIG. 1, and FIG. 11 is a cross-sectional view taken along line C-C in FIG. 1. The board 88 illustrated in FIG. 7 is arranged in the closed section 10a, the opening 12 is closed by the board 88, and the fins 89 are exposed to the open section 10b from the opening 12. The opening 12 is closed by the board 88, and thus the outside air does not flow into the closed section 10a. However, the outside air flows into the open section 10b from the flow inlet 13.

The blower 6 illustrated in FIG. 8 is housed in the first space 20a. The blower 6 blows air from the second space 20b toward the first space 20a, and at least a portion of the impeller 64 is exposed to the second space 20b from the opening 22. In the case of the centrifugal blower illustrated in FIG. 8, a central rotational axis of the impeller 64 is orthogonal to the partition 21. Although the direction in which the housed reactor 3 is received is freely selected, the reactor 3 may be received in the third unit 30 such that the central axis of the reactor 3 is aligned with the direction from the second vent 23 to the flow outlet 31 in the case in which the second vent 23 and the flow outlet 31 face each other. Such alignment can achieve cooling of the reactor 3 with good efficiency The reactor 3 is fixed by bolts to a non-illustrated frame, and the frame is fixed to the interior of the housing of the third unit 30.

Flow of air is indicated by the outlined-type arrows in FIGS. 9 and 11. The outside air flowing into the open section 10b from the flow inlet 13 passes through the fins 89 and flows into the second space 20b through the first vent 14. When the impeller 64 rotates due to operation of the blower electric motor 63, the air of the second space 20b is sucked through the opening 22 into the impeller 64 due to negative pressure at the center of the impeller 64, and is discharged to the first space 20a. The air discharged into the first space 20a passes through the second vent 23 and flows into the third unit 30. The air flowing into the third unit 30 passes through the reactor 3 and is discharged to the exterior of the power conversion device 1 from the flow outlet 31. The power conversion device 1 can cool the reactor 3 and the electronic components included in the power conversion units 70 and 80 due to the power conversion device 1 having the flow path of air from the flow inlet 13 to the flow outlet 31 through the first vent 14, the opening 22, and the second vent 23. Structure of the power conversion device 1 is simple due to the lack of an exhaust duct and a casing of the blower 6.

Assembling the first unit 10, the second unit 20, the third unit 30, and the fourth unit 40 to form the power conversion device 1 can simplify the structure of the power conversion device 1, and the electronic components included in the power conversion device 1 can be arranged at suitable positions as required for cooling, as well as required for dust prevention and moisture prevention.

In the case in which the partitions 11 and 21 are horizontally disposed as illustrated in the example of FIG. 1, the electronic components of each of the units can be attached from the upper surface of the power conversion device 1, and thus assembly is easy.

In the aforementioned manner, the power conversion device 1 according to the embodiment includes the first unit 10 having the open section 10b and the closed section 10a containing the electronic components, the second unit 20 containing the blower 6, the third unit 30 containing the reactor 3, and the flow path of air from the flow inlet 13 to the flow outlet 31 through the first vent 14, the opening 22, and the second vent 23; and thus structure of the power conversion device 1 can be simplified while maintaining cooling performance.

The present disclosure is not limited to the above embodiment. Although one each of the units is provided in the power conversion device 1 in the example of FIG. 1, the power conversion device 1 may be formed by a freely selected assembly of units provided with at least one first unit 10, at least one second unit 20, and at least one third unit 30. Although the sizes of each of the units in the example of FIG. 1 are the same, these sizes may differ in accordance with the electronic components housed in each of the units. In the case of a large number of power conversion units, the power conversion device 1 may be provided with multiple first units 10, and the sizes of the first units 10 may be large in comparison to the other units. Although the power conversion device 1 is disposed on the roof of the electric railway vehicle in the example of FIG. 1, disposal is possible below the floor of the electric railway vehicle by reversing the vertical direction.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Power conversion device
2 Switch
3 Reactor
4 Controller
5 Smoothing circuit
6 Blower
10 First unit
10a Closed section
10b Open section
11, 21 Partition
12, 22 Opening
13 Flow inlet
14 First vent
14a, 23a Flow outlet
14b, 23b Flow inlet
20 Second unit
20a First space
20b Second space
23 Second vent
30 Third unit
31 Flow outlet
40 Fourth unit
61 Base
62 Support
63 Blower electric motor
64 Impeller
70, 80 Power conversion unit
71, 81 Capacitor
72, 73, 74, 75, 76, 77, 82, 83, 84, 85, 86, 87 Switching element
88 Board
89 Fins
101 Power line
102 Power collector
103 Electric motor
104 Load device

The invention claimed is:

1. A power conversion device comprising:
a power conversion unit to convert an input power and output the converted power;
a reactor connected to an input side of the power conversion unit;
a controller to control electronic components included in the power conversion unit;
a first unit, an interior of a housing thereof being divided by a partition into a closed section into which outside air does not flow and an open section into which the outside air flows, the closed section containing the electronic components, the first unit comprising a heat sink exposed to the open section and releasing heat transferred from the electronic components;
a second unit, an interior of a housing thereof being divided into a first space and a second space by a partition having an opening, the second unit being adjacent to the first unit, the second unit containing in the first space a blower for blowing air from the second space toward the first space, the blower having an impeller at least partially exposed to the second space from the opening; and
a third unit adjacent to the second unit and containing the reactor,
wherein a first vent is formed in a part at which a housing forming the open section contained within the first unit and a housing forming the second space contained within the second unit contact each other,
a flow inlet into which the outside air flows is formed in the housing forming the open section contained within the first unit,
a second vent is formed in a part at which a housing forming the first space contained within the second unit and a housing of the third unit contact each other,
a flow outlet is formed in the housing of the third unit and discharges air flowing in from the second vent, the flow outlet and the second vent facing each other,
the blower does not comprise a casing and is housed in the second unit,
the partition of the first unit and the partition of the second unit are horizontal,
a vertical direction upper part of the first unit is the closed section, and a vertical direction lower part of the first unit is the open section,
a space of a vertical direction upper part of the second unit is the first space, and a vertical direction lower part of the second unit is the second space, and
the reactor is received in the third unit such that a central axis of the reactor is aligned with a direction from the second vent to the flow outlet.

2. The power conversion device according to claim 1, wherein the partition of the second unit abuts against an inner face of the housing of the second unit.

3. The power conversion device according to claim 2, wherein the partition of the second unit is orthogonal to a rotational axis of the impeller.

4. The power conversion device according to claim 2, further comprising a fourth unit into which the outside air does not flow, the fourth unit containing the controller.

5. The power conversion device according to claim 4, further comprising:
a switch housed in the fourth unit and connected to the input side of the power conversion unit; and
a smoothing circuit housed in the fourth unit and connected to an output side of the power conversion unit, wherein the blower is driven by an output of the power conversion unit smoothed by the smoothing circuit.

6. The power conversion device according to claim 1, wherein the partition of the second unit is orthogonal to a rotational axis of the impeller.

7. The power conversion device according to claim 6, further comprising a fourth unit into which the outside air does not flow, the fourth unit containing the controller.

8. The power conversion device according to claim 7, further comprising:
   a switch housed in the fourth unit and connected to the input side of the power conversion unit; and
   a smoothing circuit housed in the fourth unit and connected to an output side of the power conversion unit, wherein
   the blower is driven by an output of the power conversion unit smoothed by the smoothing circuit.

9. The power conversion device according to claim 1, further comprising a fourth unit into which the outside air does not flow, the fourth unit containing the controller.

10. The power conversion device according to claim 9, further comprising:
   a switch housed in the fourth unit and connected to the input side of the power conversion unit; and
   a smoothing circuit housed in the fourth unit and connected to an output side of the power conversion unit, wherein
   the blower is driven by an output of the power conversion unit smoothed by the smoothing circuit.

11. The power conversion device according to claim 1, wherein
   the power conversion device is to be disposed on a roof of a vehicle.

12. The power conversion device according to claim 1, further comprising:
   a fourth unit into which the outside air does not flow, the fourth unit containing the controller, wherein
   a direction in which the first unit and the second unit are adjacent to each other is orthogonal to a direction in which the second unit and the third unit are adjacent to each other, and
   the fourth unit is adjacent to the first unit and the third unit.

* * * * *